(12) United States Patent
Yamada et al.

(10) Patent No.: US 6,833,668 B1
(45) Date of Patent: Dec. 21, 2004

(54) ELECTROLUMINESCENCE DISPLAY DEVICE HAVING A DESICCANT

(75) Inventors: Tsutomu Yamada, Motosu (JP); Naoaki Komiya, Ogaki (JP)

(73) Assignee: Sanyo Electric Co., Ltd. (JP)

( * ) Notice: Subject to any disclaimer, the term of this patent is extended or adjusted under 35 U.S.C. 154(b) by 319 days.

(21) Appl. No.: 09/656,482

(22) Filed: Sep. 7, 2000

(30) Foreign Application Priority Data

Sep. 29, 1999 (JP) .............................. 11-277089
Sep. 29, 1999 (JP) .............................. 11-277090

(51) Int. Cl.⁷ ............................................. H05B 33/00
(52) U.S. Cl. ...................................... 313/505; 313/512
(58) Field of Search ................................ 313/505, 502, 313/503, 509, 506, 504, 483, 500, 498–512, 9

(56) References Cited

U.S. PATENT DOCUMENTS 4,143,297 A * 3/1979 Fischer ....................... 313/502
6,175,186 B1 * 1/2001 Matsuura et al. ........... 313/483
6,284,342 B1 * 9/2001 Ebisawa et al. .............. 428/69

FOREIGN PATENT DOCUMENTS

JP          9148066 A       6/1997

* cited by examiner

Primary Examiner—Joseph Williams
(74) Attorney, Agent, or Firm—Cantor Colburn LLP (57) ABSTRACT

Powder desiccant is mixed into a seal which adheres a first substrate to a second substrate, thereby sealing a display region. Almost no moisture permeates through the outer surfaces of the substrates sandwiching the display region, while moisture permeating through the seal is adsorbed by the desiccant. An emissive layer is thereby prevented from deterioration due to moisture. By covering the display region with a resin sealing layer composed of resin having desiccant mixed therein, the display region can reliably be protected from moisture. By forming a groove in the substrate and placing a desiccant therein, moisture can be further reliably adsorbed.

44 Claims, 7 Drawing Sheets

ELECTROLUMINESCENCE DISPLAY DEVICE HAVING A DESICCANT

BACKGROUND OF THE INVENTION

1. Field of the Invention

The present invention relates to a display comprising an electroluminescence (hereinafter referred to as "EL") element disposed on a substrate, and particularly to a sealing structure for an organic EL display device including an organic EL layer.

2. Description of the Related Art

Figure 1A:
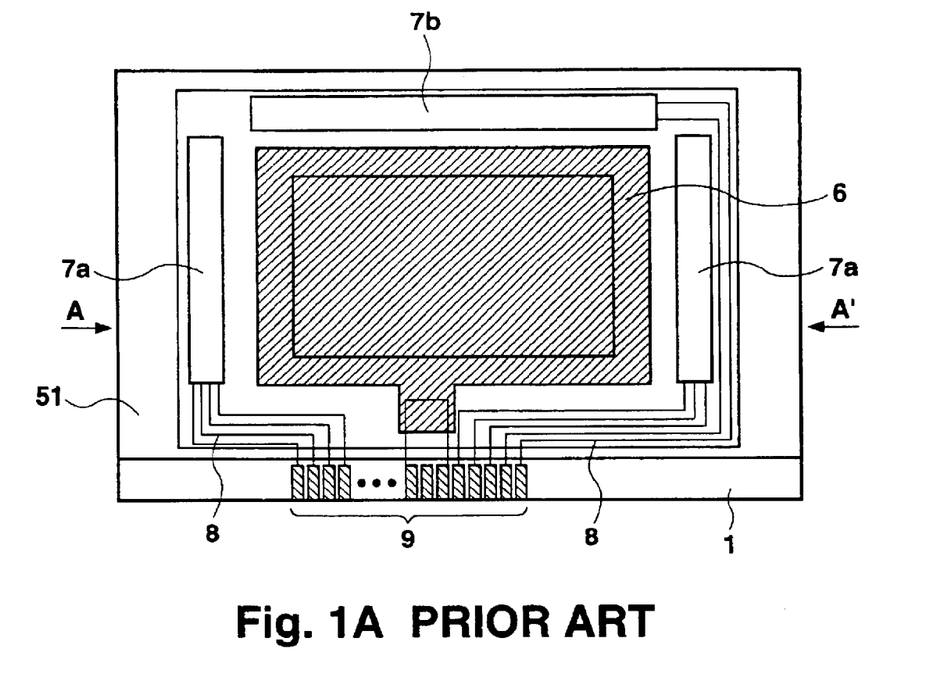
FIGS. 1A and 1B are diagrams showing a configuration of a conventional organic EL display device.
Figure 1B:
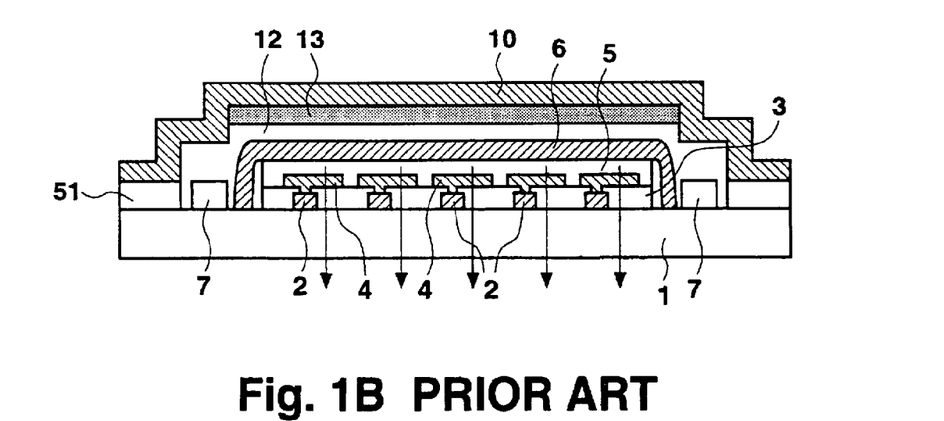

A display device using organic EL comprises a self-emissive element which itself generates light when an electric current is made to flow through the element. Such a display device consumes less power compared to a CRT, and does not have the problem concerning viewing angle as in an LCD. Organic EL display devices are therefore regarded as devices that may replace both CRTs and LCDs. FIG. 1A is a plan view of a conventional organic EL display device, and FIG. 1B shows a cross-sectional view taken along line A—A' of FIG. 1A. A plurality of selective drive circuits 2 are disposed for respective pixels on a transparent substrate 1. Each selective drive circuit 2 is connected with a pixel electrode 4. An organic EL layer 5 including an organic emissive material, and a counter electrode 6 are disposed covering the pixel electrodes 4. Surrounding the pixel region constituted by the selective drive circuits 2, pixel electrodes 4, organic EL layer 5, and counter electrode 6, display driver circuits 7a, 7b are arranged for controlling the selective drive circuits 2 and applying predetermined voltages to the pixel electrodes 4. The driver circuits 7 are connected to terminals 9 by wiring 8. A cap 10 composed of a metal such as aluminum is arranged covering these structures, and is adhered to the transparent substrate 1 using a seal 51. The space 12 between the cap 10 and the transparent substrate 1 is filled with dry nitrogen gas. A desiccant sheet 13 is disposed on the inner surface of the cap 10.

A selective drive circuit 2 may comprise, for example, a plurality of semiconductor elements including thin film transistors (TFT). A first TFT switches between "on" (conductive state) and "off" (non-conductive state) in response to the output from the driver circuit 7a. When the first TFT of a selective drive circuit 2 is turned on by an output from the driver circuit 7a, the corresponding pixel electrode 4 is applied with a voltage according to an output from the driver circuit 7b via a second TFT. An electric current thereby flows between the pixel electrode 4 and the counter electrode 6. The emissive layer 5 is the portion which emits light when a current is made to flow therein by the pixel electrode 4 and the counter electrode 6. The emissive layer 5 emits light at an intensity according to the amount of current flowing between the pixel electrode 4 and the counter electrode 6. The generated light transmits downward in the cross-sectional view through the transparent substrate 1 to be observed.

More specifically, holes injected from the anode and electrons injected from the cathode recombine within the organic EL layer 5. As a result, organic molecules containing the organic EL layer 5 are excited, generating excitons. Through the process in which these excitons undergo radiation until deactivation, light is emitted from organic EL layer 5. This light radiates outward through the side of the transparent anode via the transparent insulator substrate 1, resulting in light emission.

The TFTs and organic EL layer 5 formed through lamination must be shielded from the external atmosphere. A cap 10 made of a metal such as aluminum is therefore adhered to the periphery of the insulating substrate 1 by a seal 51 composed of a sealing material such as epoxy. This arrangement is provided mainly for preventing deterioration of display quality when, for example, a defect such as a pinhole is present in the counter electrode 6. In such a case, moisture entering from the pinhole may cause oxidation of the counter electrode 6 or a separation between the organic EL layer 5 and the counter electrode 6, producing dark spots and resulting in degradation of display quality. In this light, the cap 10 not only protects the display region and the driver circuits 7 from physical shock, but also serves to prevent moisture from entering the device. The cap 10 is therefore formed in a shape of a tray covering the display region. Further, to prevent damage by penetrating moisture, the space 12 inside the cap 10 is filled with an inert gas such as dry nitrogen or helium, and the desiccant sheet 13 is disposed. A stepped portion may be provided in the location for arranging the desiccant sheet 13. The structure as described above is disclosed, for example, in Japanese Patent Laid-Open Publication No. Hei 9-148066.

However, in a conventional sealing structure, moisture may still be present inside the device. For example, moisture may be present in the nitrogen gas filled in the space 12. Moreover, as the desiccant sheet 13 is arranged on the cap 10, it is possible that moisture may adhere to the organic EL layer without being adsorbed by the desiccant sheet 13.

SUMMARY OF THE INVENTION

The object of the present invention is to provide an element sealing structure for reliably preventing penetration of moisture into areas around self-emissive elements without increasing the device thickness.

Another object of the present invention is to enhance the aperture ratio of each pixel while realizing a reliable sealing structure.

A further object of the present invention is to simplify the device manufacturing process while realizing a reliable sealing structure.

The present invention for achieving the above objects provides a display device in which a display region having a self-emissive element is formed between a pair of substrates, wherein a resin having a desiccant mixed therein is disposed between the pair of substrates.

Another aspect of the display device of the present invention is that the pair of substrates are adhered to one another by a sealing material disposed surrounding at least the display region, so as to seal the display region including the self-emissive element.

A further aspect of the display device of the present invention is that the self-emissive element is an electroluminescence element, and especially an organic electroluminescence element.

According to the display device of the present invention as described above, a resin having a desiccant mixed therein is disposed between a pair of substrates. Moisture penetrating inside the display device can be adsorbed by the desiccant, thereby preventing deterioration of the display region by the moisture.

Furthermore, the pair of substrates are adhered to one another by a seal formed surrounding the display region, and a desiccant is mixed in the seal. The amount of moisture permeating through the substrates is negligible. The moisture permeating through the seal is adsorbed by the desiccant. Accordingly, almost no moisture penetrates inside the display device, and deterioration of the display region by moisture can effectively be prevented.

In another aspect of the display device of the present invention, the display region having the self-emissive element is formed on the first substrate among the pair of substrates, the second substrate is arranged facing the display region side of the first substrate and adhered to the first substrate, a color component is provided in the gap between the second substrate and the display region, and the second substrate is a transparent substrate which transmits at least visible light.

As described above, a color component is provided between the display region and the second substrate facing the first substrate having the display region formed thereon. Further, the second substrate is a transparent substrate which transmits visible light. According to this arrangement, the aperture ratio of the display pixels can be enhanced, and increased freedom is available in selecting the size and the driving capability of a TFT when using a TFT for driving the display region. By providing a color component on a separate substrate facing the substrate having the TFT, the manufacturing process can be simplified. Furthermore, the present device prevents display deterioration due to moisture.

In a further aspect of the display device of the present invention, the display region having the self-emissive element is formed on the first substrate among the pair of substrates, the second substrate is arranged facing the display region side of the first substrate and adhered to the first substrate, and a spacer composed of a desiccant is provided in the gap between the second substrate and the display region.

As described above, between the display region and the second substrate facing the first substrate having the display region formed thereon, a fluorescent converting layer which converts a light having a predetermined color into a light of a different color is provided as a color component. Further, a spacer composed of a desiccant is disposed between the fluorescent converting layer and the display region. Accordingly, moisture inside the display device can be adsorbed even when no desiccant sheet is included. In addition, the aperture ratio of the display device can be improved because the spacer is made of a desiccant, and there is no need to dispose a separate desiccant other than the spacer itself.

In a still further aspect, the present invention provides a display device in which a display region having a self-emissive element is formed between a pair of substrates, wherein the pair of substrates are adhered to one another by a sealing material disposed surrounding at least the display region to seal the display region, a groove is formed in at least one of the pair of substrates on a side facing the other substrate in a location where the sealing material is disposed, and a desiccant is filled in the groove.

Another aspect of the display device of the present invention is that a resin having a desiccant mixed therein is used as the sealing material.

As described above, a groove is formed surrounding at least one of the substrates, and desiccant is filled in the groove. Accordingly, desiccant can be disposed at a plentiful amount in the groove, and moisture permeation can be prevented more reliably.

Furthermore, as the groove is covered with the seal for adhering the pair of substrates to one another, the desiccant in the groove is not exposed to the external atmosphere. The desiccant is thereby prevented from adsorbing unnecessary moisture, and can serve for a longer period of time to adsorb moisture permeating through the seal.

In addition, moisture can be adsorbed uniformly from the entire display region because the resin having the desiccant mixed therein is formed covering the display region. According to this arrangement, moisture can be adsorbed more effectively than by disposing a desiccant sheet. Moreover, thickness of the display device can be reduced because there is no need to dispose a desiccant sheet.

Moreover, the resin formed covering the display region fills between the display region and the second substrate facing the first substrate having the display region formed thereon. Unnecessary space is thereby eliminated, further reducing the thickness of the display device while still preventing deterioration by moisture.

According to another aspect of the present invention, there is provided an electroluminescence display device in which an emissive display region having a self-emissive element is formed on a transparent first substrate, wherein the self-emissive element comprises a first electrode, a second electrode, and an emissive element layer formed between the first and the second electrodes. The self-emissive element is covered with a coating resin layer composed of a resin cured by ultraviolet irradiation. Further, a second substrate which transmits ultraviolet rays is arranged over the coating resin layer so as to face the first substrate.

A further aspect of the electroluminescence display device of the present invention is that a desiccant is mixed in the coating resin layer.

A still further aspect of the electroluminescence display device of the present invention is that the coating resin layer having a desiccant mixed therein covers the self-emissive element and fills the gap between the first and the second substrates.

In another aspect of the electroluminescence display device of the present invention, the self-emissive element is composed by laminating, in order from the first substrate side, the first electrode, the emissive element layer, and the second electrode, and the coating resin layer covers the self-emissive element from the second substrate side.

In a further aspect of the electroluminescence display device of the present invention, a light-shielding layer for blocking ultraviolet rays is disposed between the emissive element layer and the coating resin layer.

In a still further aspect of the electroluminescence display device of the present invention, the second electrode simultaneously serves as the light-shielding layer.

According to the above-described arrangement, ultraviolet light can be irradiated through the second substrate to cure the coating resin layer. At that time, the light-shielding layer prevents irradiation of ultraviolet rays on the organic EL layer and on the selective drive circuits formed within the display region on the active matrix panel, which in turn prevents transformation and deterioration of the selective drive circuits and the organic EL layer.

When the second electrode simultaneously serves as the light-shielding layer, the selective drive circuits and the organic EL layer can be protected from ultraviolet irradiation by the second electrode without providing a separate light-shielding layer, while the second electrode sufficiently operates as an electrode. By using a metal second electrode, ultraviolet light can be reflected. The reflected ultraviolet light can again be irradiated on the coating resin layer, increasing the efficiency of ultraviolet irradiation.

Further, moisture is prevented from adhering to the organic EL layer because a desiccant is mixed in the coating resin layer. Accordingly, deterioration due to moisture can be prevented, achieving a display device having a long life. Thickness of the display device can be reduced because there is no need to dispose a desiccant sheet. Moreover, water resistance is further enhanced compared to when a desiccant sheet is used, because the coating resin layer including a desiccant uniformly covers the display region.

The desiccant is a substance having a chemically adsorptive property in the form of a powder having a particle diameter of 20 µm or smaller. The desiccant is mixed in the resin sealing layer by at least 10 wt %, but no more than 50 wt %. In this way, sufficient moisture absorption can be achieved without obstructing hardening of the resin having the desiccant mixed therein, and without reducing the resin viscosity before curing or the resin hardness after curing.

DESCRIPTION OF PREFERRED EMBODIMENTS

First Embodiment

Figure 2A:
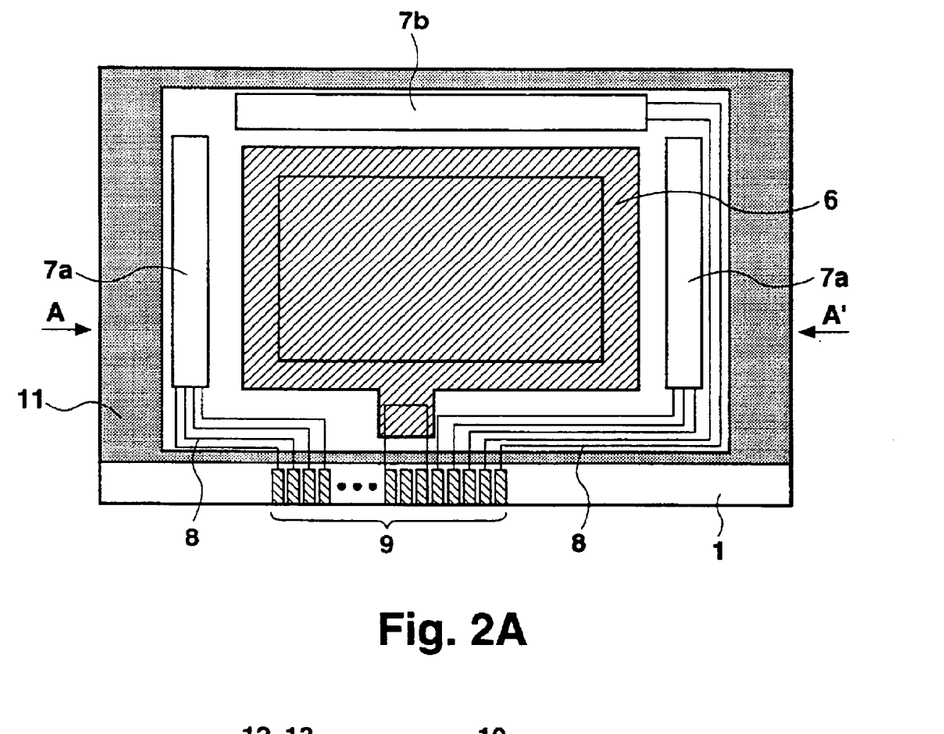
FIGS. 2A, 2B, and 2C are diagrams showing a configuration related to a first embodiment of the organic EL display device according to the present invention.
Figure 2B:
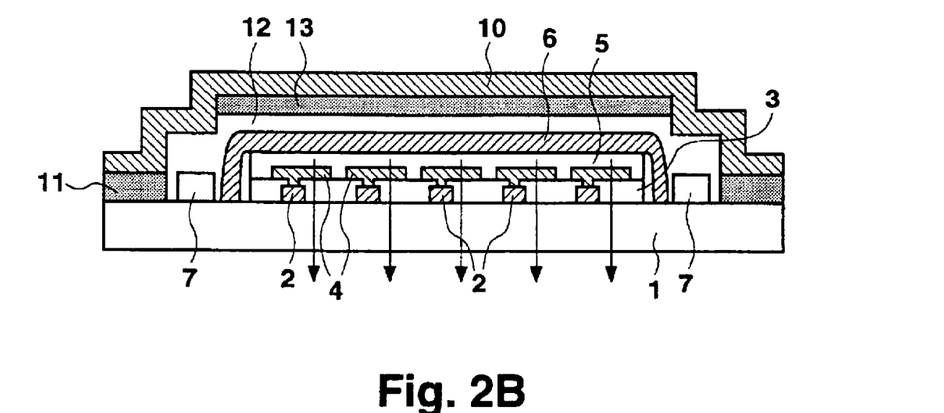

FIG. 2A is a plan view of an organic EL display device according to a first embodiment of the present invention, and FIG. 2B shows a cross-sectional view taken along line A—A' of FIG. 2A. Structures similar to those in the conventional device described earlier are labeled with the same reference numerals, and detailed explanation of those structures will not be repeated. Selective drive circuits 2 are disposed for respective pixels on a transparent substrate 1. A pixel electrode 4 is provided over each selective drive circuit 2 with a planarizing insulating film 3 interposed therebetween. An organic EL layer 5 and a counter electrode 6 are disposed covering those structures. The region including the selective drive circuits 2, planarizing insulating film 3, pixel electrodes 4, organic EL layer 5, and counter electrode 6 constitutes the display region. Arranged surrounding the pixel region are display driver circuits 7a, 7b for controlling emission/non-emission in each pixel to create a display image, by controlling the selective drive circuits 2 and applying predetermined voltages to the pixel electrodes 4.

The driver circuits 7 are connected by wiring 8 to terminals 9 for external connection.

An organic EL layer 5 is formed with respect to each pixel for producing a different color for each pixel.

Figure 2C:
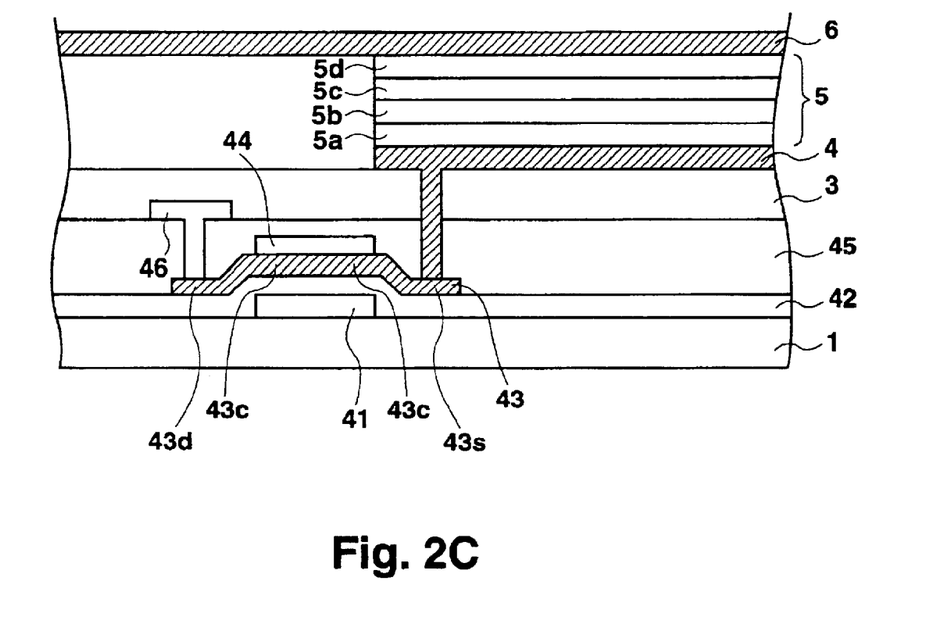

FIG. 2C is a detailed cross-sectional view showing one pixel of an active matrix type display device employed in the present embodiment. A gate electrode 41 made of a refractory metal such as Cr or Mo is formed on an insulator substrate 1 made of quartz glass, non-alkali glass, or a similar material. Over the gate electrode 41, a gate insulating film 42 composed of $SiN/SiO_2$ and an active layer 43 composed of polysilicon film are sequentially formed. The active layer 43 includes a channel 43c and, on both sides of the channel 43c, a source 43s and a drain 43d which are high concentration doped regions. The source 43s and the drain 43d are provided in the so-called LDD (lightly doped drain) structure. Specifically, ion doping is performed by using the stopper insulating film 44 located over the channel 43 as a mask, then further ion doping is performed by covering both sides of the gate electrode 41 with a resist. As a result, low concentration doped regions and high concentration doped regions are created on both sides of the gate electrode 41, forming the LDD structure. The selective drive circuit 2 is a generic term for referring to the gate electrode 41, the gate insulating film 42, and the active layer 43.

An interlayer insulating film 45 formed by a sequential lamination of a $SiO_2$ film, a SiN film, and a $SiO_2$ film is provided on the entire surface over the gate insulating film 42, the active layer 43, and the stopper insulating film 44. A contact hole formed in a position corresponding to the drain 43d is filled with a metal such as Al to form a connection with a power source line 46. Further, a planarizing insulating film 47 made of an organic resin or a similar material is formed over the entire surface for planarization. Subsequently, a contact hole is formed in the planarizing insulating film 47 in a position corresponding to the source 43s. A transparent electrode 3 composed of ITO (indium tin oxide) or a similar material is formed through this contact hole to contact the source 43s.

The organic EL layer 5 is an emissive element layer comprising a first hole-transport layer 5a composed of MTDATA (4,4',4"-tris(3-methylphenylphenylamino) triphenylamine), a second hole-transport layer 5b composed of TPD (N,N'-diphenyl-N, N'-di(3-methylphenyl)-1,1'-biphenyl-4,4'-diamine), an emissive layer 5c formed of $Bebq_2$ (bis(10-hydroxybenzo[h]quinolinato)beryllium) including quinacridone derivatives, and an electron transport layer 5d made of $Bebq_2$. The above-described structure is disclosed in, for example, Japanese Patent Applications No. Hei 11-22183 and No. Hei 11-22184, which do not constitute prior art for the present invention.

In the above-described organic EL layer 5, holes injected from the anode and electrons injected from the cathode recombine within the organic EL layer 5. As a result, organic molecules constituting the organic EL layer 5 are excited, generating excitons. Through the process in which these excitons undergo radiation until deactivation, light is emitted from organic EL layer 5. This light radiates outward through the transparent anode via the transparent insulator substrate 1, resulting in light emission.

In the present embodiment, the display region having the above-described configuration is covered with a metal cap (seal substrate) 10, which is a second substrate arranged facing the substrate 1. A desiccant sheet 13 is disposed on the inner surface of the cap 10.

Further, in the present embodiment, powder desiccant is mixed in the seal 11 adhering the cap 10 to the transparent substrate 1.

The seal is formed using a synthetic resin such as an acrylic resin, and such a synthetic resin permeates a slight amount of moisture. While moisture permeation amount differs depending on the type of resin, as an example, the commercially available XNR5493T manufactured by Nagase Chiba corporation, has a relatively low moisture permeability and permeates 7 g/m$^2$ of moisture per day at a temperature of 60° C. and a humidity of 90%, according to the product catalog. When permeated moisture adheres to the display region before being adsorbed by the desiccant sheet 13, deterioration of the organic EL layer 5 may result. However, in the present embodiment, almost no moisture permeates through the seal to penetrate into the sealed space because powdered desiccant is mixed into the seal 11.

The seal 11 is made of epoxy resin or a similar material, and preferably is of a type cured by mixing two agents or by ultraviolet irradiation. A thermosetting type is not appropriate because the organic EL layer 5 may deteriorate under heating. Viscosity of the resin before hardening should be approximately between 100,000 cps and 300,000 cps. To uniformly mix the desiccant, it is desirable to use a resin having the minimum possible viscosity within the range that the resin does not flow before hardening.

The desiccant is mixed into the seal 11 before curing. By curing the resin after the mixture is thoroughly mixed, the desiccant can be uniformly mixed in the seal 11. For the desiccant, a substance having a chemically adsorptive property is used. Examples of chemically adsorptive desiccants include oxides of alkali earth metals such as calcium oxide, barium oxide, halides of alkali earth metals such as calcium chloride, and phosphorus pentaoxide. Physically adsorptive desiccants such as silica gel are not appropriate because such desiccants discharge adsorbed moisture at a high temperature.

Second Embodiment

Figure 3A:
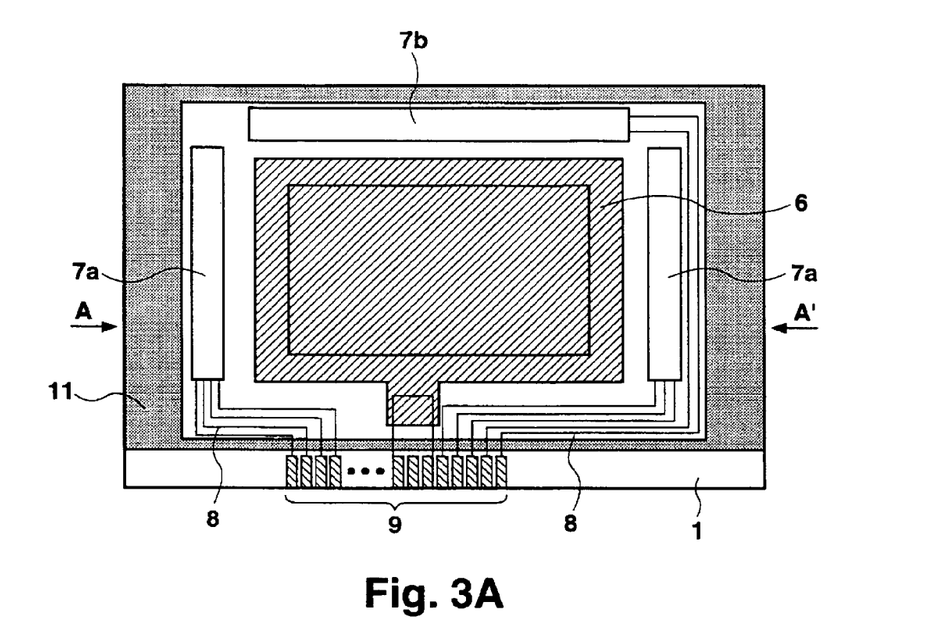
FIGS. 3A and 3B are diagrams showing a configuration related to a second embodiment of the organic EL display device according to the present invention.
Figure 3B:
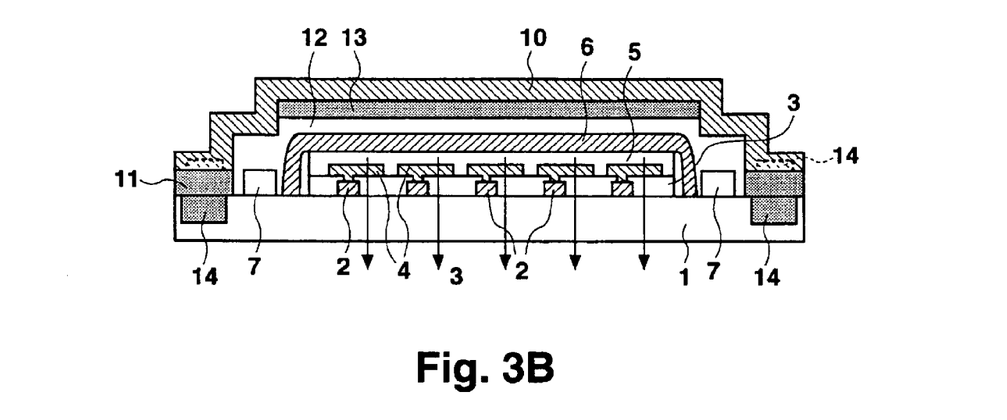

FIG. 3A is a plan view of an organic EL display device according to a second embodiment of the present invention. FIG. 3B shows a cross-sectional view taken along line A—A' of FIG. 3A. Structures similar to those described above in the first embodiment or earlier in the specification are labeled with the same reference numerals, and their detailed explanation will not be repeated.

The feature of the present embodiment is that a groove is formed in the transparent insulating substrate 1 in a portion under the seal 11, and a desiccant 14 is placed inside the groove.

As explained above, to prevent the seal 11 from flowing before hardening, a resin used for the seal 11 must have a certain degree of viscosity. This requirement for viscosity makes it difficult to uniformly mix the desiccant into the seal resin. In addition, the amount of desiccant to be mixed must be restricted to prevent loss of resin viscosity before curing. As the width of the seal 11 is also limited and cannot be made large considering the layout, the amount of desiccant to be mixed is further suppressed. For these reasons, it may not be possible to completely adsorb the permeating moisture. To solve this problem, in the present embodiment, a groove is formed in the transparent substrate 1, and a desiccant 14 is placed therein. The desiccant 14 can be placed in the groove by mixing the desiccant into a resin having low viscosity and pouring the mixture into the groove for subsequent curing. The seal 11 can be formed after the desiccant 14 is disposed in the groove. The desiccant 14 in the groove may be formed by holding in place granular desiccant having a large particle diameter using a low viscosity resin, as described above, or alternatively, by shaping a desiccant according to the shape of the groove and fitting it in the groove. By either method, the desiccant 14 can be placed in the groove at an amount sufficiently large relative to the amount of moisture permeating through the seal 11, namely, at an amount sufficient for absorbing moisture penetrating through the seal. Most of the moisture penetrating through the seal 11 is adsorbed by the desiccant mixed in the resin within the groove, almost completely preventing moisture penetration into the sealed space 12.

When exposed to external air, the desiccant 14 adsorbs moisture plentiful in the external atmosphere and therefore quickly loses its adsorbing capability. Accordingly, it is preferable to position the desiccant 14 covered under the seal 11 such that the desiccant 14 is not exposed to the outside. By additionally mixing a desiccant into the seal 11, prevention of moisture penetration into the sealed space 12 can obviously be further enhanced.

While the groove is formed only in the first substrate in the present embodiment and the fourth and sixth embodiments described below, it is further effective to form a groove also in the facing second substrate (in the present embodiment, the cap 10) and place a desiccant therein.

Third Embodiment

Figure 4:
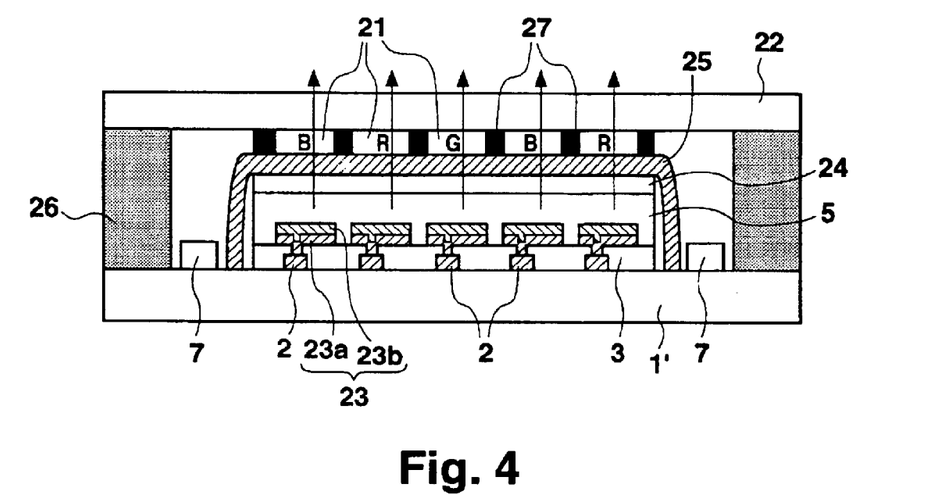
FIG. 4 is a cross-sectional view showing a configuration related to a third embodiment of the organic EL display device according to the present invention.

FIG. 4 shows a cross-sectional view of an organic EL display device according to a third embodiment including color filters 21 as color components and having a first substrate 1' and a second substrate 22. Structures similar to those described above in the first or second embodiments or earlier in the specification are labeled with the same reference numerals, and their detailed explanation will not be repeated. In the present embodiment, differing from the first embodiment, light radiating from the organic EL layer 5 is emitted upward in the figure through a transparent counter electrode 25. The organic EL layer 5 emits white light from its entire surface. This light is emitted through the color filters 21 as lights having different colors to provide color indication.

The pixel electrode 23 is formed by a laminated structure comprising a lower layer 23a and an upper layer 23b. The lower layer 23a is made of a non-transparent conductive material such as molybdenum (Mo), and formed over a surface including the planarizing insulating film 3 and the contact hole created in the planarizing insulating film 3. The upper layer 23b is made of ITO and formed on the lower layer 23a. The shapes of the lower Mo layer 23a and the upper ITO layer 23b may be identical. The lower layer 23a is provided for reflecting the light generated by the organic EL layer 5 to achieve efficient light emission. The non-transparent conductive material maybe aluminum (Al), silver (Ag), or other similar materials, without being limited to Mo. The upper ITO layer 23b is provided because of its high work function for achieving efficient light emission from the organic EL layer 5.

A buffer layer 24 is formed between the counter electrode and the organic EL layer 5 using a material having a high work function, which may be an alkali metal such as lithium, sodium and potassium, an alkali earth metal such as calcium and magnesium, or fluorine compounds of those metals.

The second substrate 22 is a transparent substrate made of a material such as glass or synthetic resin. Because the device of the present embodiment emits light from the second substrate 22 side as shown in FIG. 4, the first substrate 1' may either be transparent or non-transparent.

Light generated in the organic EL layer 5 is emitted outward via the transparent counter electrode 25 (in the upper direction as indicated by the arrows in the figure). In other words, light is emitted from the insulating substrate 22 side of the device, the side which does not have the selective drive circuits 2 including TFTs and other components formed thereon. The counter electrode 25 is formed facing the plurality of selective drive circuits 2 and pixel electrodes 23, so as to cover the entire display region as shown in FIG. 4.

The color filters 21, which are the color components formed on the transparent second insulating substrate 22, will next be explained. As shown in FIG. 4, the color filters 21 for each of the colors red (R), green (G), and blue (B) are formed on the second substrate 22 made of a transparent film or glass substrate, on the side facing the counter electrode 25.

The second substrate 22 and the first substrate 1' are fixed to one another by a seal 26 adhering the peripheries of the substrates. The color filters 21 for each colors of R, G, and B are provided corresponding to the respective display pixels each including the organic EL layer 5 and TFTs. A black matrix (BM) 27 may be provided for blocking light between different colors. Light generated from the organic EL layer 5 is emitted in the direction shown by the arrows via the color filters 21, producing the color of each filter.

Emissive materials that can be used for the organic EL layer 5 in the present embodiment will next be explained. The emissive material of the organic EL layer 5 is selected according to the color component provided above the organic EL layer 5. When color filters 21 of R, G, and B are used as the color components as in the present embodiment, it is preferable to use an emissive material generating a white light in the organic EL layer 5. In such an instance, the material of the organic EL layer 5 maybe, for example, ZnBTZ complex, or a laminated structure composed of TPD (aromatic diamine), p-EtTAZ (1,2,4-triazol derivative), and Alq ("Alq" referred to herein denotes Alq doped with Neal red which is a red light emitting pigment).

Concerning the sealing agent for adhering the transparent insulating substrate 22 to the insulating substrate 1', the seal 26 is composed of an epoxy resin having a desiccant such as calcium oxide, phosphorus pentaoxide, or calcium chloride mixed therein. By mixing a desiccant in the sealing agent, moisture inside the sealed space formed by the two substrates 1', 22 and the seal 26 can be absorbed by the desiccant. As a result, display deterioration due to harmful effects by the moisture on each layer composed of organic materials can be prevented. The composition of the seal 26 is basically the same with the seal 11 of the first embodiment. When light is radiated outward from the upper side of the device as in the present embodiment, it is impossible to dispose a desiccant sheet 13 as in FIG. 3B. In a device having such a configuration, the desiccant in the seal 26 is extremely important.

When the direction of light emission from the organic EL layer 5 is towards the insulating substrate 1' having TFTs, the emitted light is blocked by the TFTs, resulting in limited aperture ratio of the display pixels.

To achieve an acceptable level of aperture ratio in such a device, the size of the TFTs must be reduced as much as possible. Because of this restriction, the TFT size and performance also become limited.

However, according to the organic EL display device of the present embodiment, light can be emitted through the second substrate 22 side having the color filters 21, without being blocked by the TFTs and other components of the selective drive circuits 2. The display device can therefore be designed with the maximum aperture ratio for each display pixel. In addition, the freedom of selection of TFT size and driving capability is increased.

Furthermore, as the aperture ratio of the display pixels can be enhanced, it is no longer necessary to increase current density to obtain a bright display. Accordingly, the life of the organic EL layer 5 can be extended.

In the present embodiment, only one type of white light emitting material is required as the emissive material for the organic EL layer 5. The color filters of the three colors R, G, and B are arranged on the transparent substrate 22, and the color filter side of the transparent substrate 22 is adhered to the counter electrode 25 side of the organic EL layer 5. The process of manufacturing is much simpler than the process of manufacturing a device in which three types of organic EL materials are used in the organic EL layer 5 for generating each of the primary colors of R, G, and B.

Further, as the generated light is emitted as the colors of the display pixels via the color filters disposed on the counter electrode side in the present embodiment, color emitting areas are larger compared to a device in which light is emitted from the TFT substrate side. Accordingly, color indication having increased brightness and vividness can be obtained.

Fourth Embodiment

Figure 5:
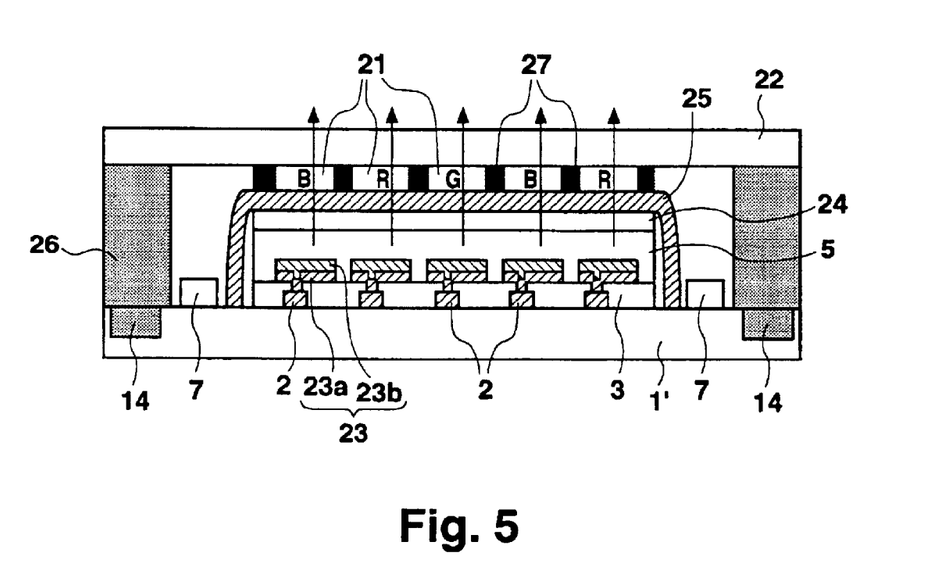
FIG. 5 is a cross-sectional view showing a configuration related to a fourth embodiment of the organic EL display device according to the present invention.

FIG. 5 shows a cross-sectional view of an organic EL display device according to a fourth embodiment of the present invention. Structures similar to those described above in earlier embodiments or elsewhere earlier in the specification are labeled with the same reference numerals, and their detailed explanation will not be repeated.

The feature of the present embodiment is that a groove is formed in the transparent insulating substrate 1 under the seal 26 as in the second embodiment, and a desiccant 14 is provided in the groove. As in the second embodiment, the desiccant 14 is disposed in the groove by mixing a sufficient amount of desiccant in a resin having high fluidity, pouring the mixture in the groove, and curing the resin. Moisture penetrating from the outside can efficiently be adsorbed by this desiccant in the groove.

Fifth Embodiment

Figure 6:
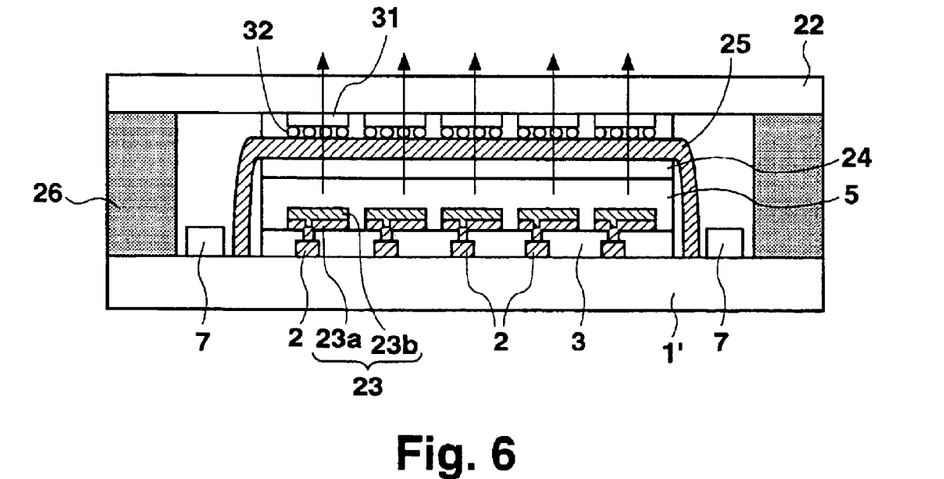
FIG. 6 is a cross-sectional view showing a configuration related to a fifth embodiment of the organic EL display device according to the present invention.

FIG. 6 shows a cross-sectional view of a display device in which a fluorescent converting layer 31 is employed as the color component. As can be seen in FIG. 6, the present embodiment differs from the third embodiment in that the fluorescent converting layer 31 is formed on the transparent insulating substrate 22 in place of the color filters 21. Further differing from the third embodiment, the organic EL layer 5 comprises, for example, a blue light emitting material, and spacers 32 composed of a desiccant are disposed between the fluorescent converting layer 31 and the counter electrode 25. A fluorescent converting layer 31 is a layer which, upon receiving irradiation of a blue light in this embodiment, emits a light of a predetermined color according to the intensity of the irradiated light. Accordingly, light can be emitted in a predetermined color without using a color filter. In addition, unlike when using a color filter, luminous energy is not attenuated because the fluorescent converting layer 31 is self-emissive.

A fluorescent converting layer 31 is formed in a position corresponding to a pixel electrode 23 by depositing an organic material using an evaporation method on the transparent insulating substrate 22 which may be a glass substrate. Subsequently, the transparent insulating substrate 22 having the fluorescent converting layer 31 formed thereon and the insulating substrate 1' are adhered to one another by the adhesive seal 26 such that the fluorescent converting layer 31 faces the counter electrode 25.

Spacers 32 are arranged between the fluorescent converting layer 31 and the counter electrode 25. A space is retained between the fluorescent converting layer 31 and the counter electrode 25 by the spacers 32. The diameter of the spacers 32 is of a size sufficient for retaining the space, and may be, for example, approximately between several μm and several hundred μm.

In the present embodiment, the spacers 32 are composed of a desiccant such as calcium oxide, phosphorus pentaoxide, and calcium chloride. The spacers 32 can absorb moisture within the sealed space created by the insulating substrate 1', transparent insulating substrate 22, and the fluorescent converting layer 31. The space around the spacers 32 may be filled with a gas such as dry nitrogen or helium, or filled with a resin.

The fluorescent converting layer 31 will next be described for an example in which a blue emissive material is used for the organic EL layer 5. A fluorescent converting layer 31 has the function to convert the color of an irradiated colored light into a different color. In order to achieve a color display of the three primary colors of R, G, and B on the display surface (in this embodiment, on the second substrate 22 side) by employing a blue emissive material as the organic EL layer 5, materials for converting blue into red and green are used for the fluorescent converting layer 31.

In a pixel in which a blue light generated by the organic EL layer 5 should be converted into a red light, the fluorescent converting layer 31 is composed using a material such as 4-dicyanomethylene-2-methyl-6-(p-dimethylaminostylryl)-4H-pyran (DCM). Using this fluorescent converting layer 31, a blue light from the organic EL layer 5 can be converted into a red light, and the red light can be emitted from the display surface.

In a pixel in which a blue light generated by the organic EL layer 5 should be converted into a green light, the fluorescent converting layer 31 is composed using a material such as 3,5,6-1H, 4H-tetrahydro-8-trifluoromethylquinolizino(9,9a, 1-gh)coumarin. In this way, a green light can be emitted from the display pixel.

In a pixel designed to emit a blue light, no fluorescent converting layer 31 need be disposed because the organic EL layer 5 generates a blue light. However, a blue converting layer may be provided to increase the blue color purity. In such a case, a converting layer 31 is formed using a blue emissive material such as oxadiazole (OXD), azomethine-zinc complex (AZM), or Al-quinoline mixed ligand complex with perylene.

In the present embodiment, only one type of blue light emitting material is required as the emissive material for the organic EL layer 5. Three types of fluorescent converting materials are simply formed in one layer on the transparent substrate 22. The manufacturing process is thus extremely simplified compared to a device in which three types of organic EL materials are used in the organic EL layer 5 for generating the three primary colors.

While the generated light from the organic EL layer 5 is blue in the present example, the present invention is not limited that configuration. The generated light from the organic EL layer 5 may be another color such as, for example, red or green. When the organic EL layer 5 generates a red light, the fluorescent converting layer 31 is formed using materials which convert the red light into blue and green lights. When the organic EL layer 5 generates a green light, the fluorescent converting layer 31 is formed using materials which convert the green light into red and blue lights.

In the present embodiment, light is emitted from the transparent insulating substrate 22 side having the fluorescent converting layer 31, without being blocked by the TFTs and other components constituting the selective drive circuits 2. The display device can therefore be designed with the maximum aperture ratio for display pixels. In addition, increased freedom is available in selecting the size and driving capability of the TFTs.

Furthermore, as the aperture ratio of the display pixels can be enhanced, it is no longer necessary to increase current density to obtain a bright indication. Accordingly, the life of the organic EL layer 5 can be extended.

Still further, because the generated light is emitted from the fluorescent converting layer 31 disposed on the negative electrode (cathode; second electrode 25) in the present embodiment, the emissive area size is larger compared to a conventional device in which light is emitted from the TFT substrate side. Accordingly, a brighter and more vivid color display can be realized.

Similarly as in the third embodiment, it is impossible to dispose a desiccant sheet 13 because the device of the present embodiment radiates light outward from the upper side. However, the desiccant constituting the spacers 32 absorbs moisture in the sealed space. In addition, by mixing a desiccant into the sealing agent 26 as in the above-described embodiments, moisture within the sealed space can further reliably be absorbed.

Sixth Embodiment

Figure 7:
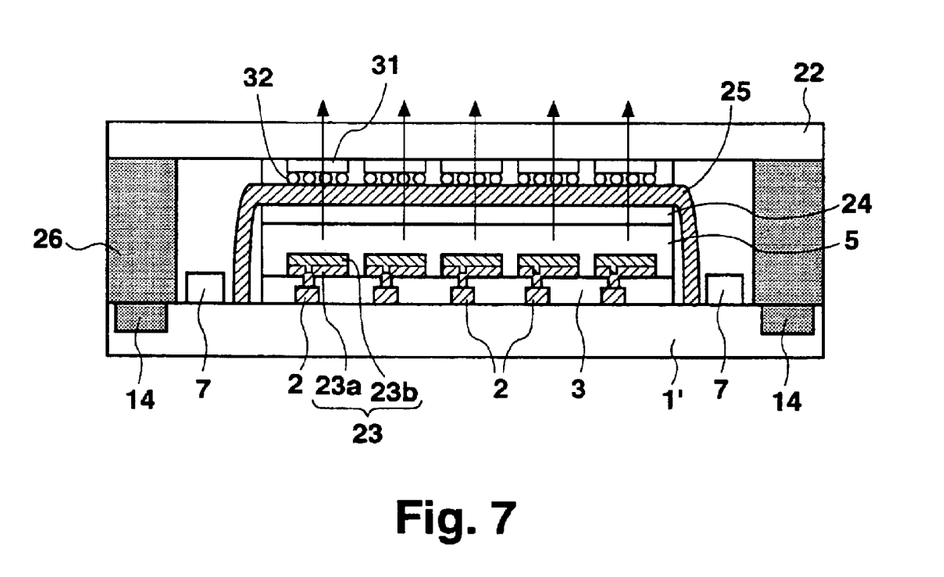
FIG. 7 is a cross-sectional view showing a configuration related to a sixth embodiment of the organic EL display device according to the present invention.

FIG. 7 shows a partial cross-sectional view of an organic EL display device according to the sixth embodiment of the present invention.

The present embodiment differs from the fifth embodiment in that a groove is formed in the peripheral portions of the insulating substrate 1' to dispose a desiccant 14.

The groove is formed by etching the insulating substrate 1' upon arranging a mask having an opening in the area of the groove on the substrate 1'.

After forming the TFTs and OEL elements on the insulating substrate 1', the desiccant is filled in the groove before adhering, using a sealing agent 26, the substrate 1' to the transparent insulating substrate 22 having the fluorescent converting layer 31. After filling of the desiccant, the two substrates 1', 22 are adhered to one another to complete the organic EL display device.

Materials such as calcium oxide, phosphorus pentaoxide, and calcium chloride may be used as the desiccant to be filled in the groove.

Moisture permeating the seal 26 and penetrating into the sealed space can be captured by the desiccant 14 filled in the groove as described above. In addition, the spacers 32 made of desiccant captures moisture between the transparent insulating substrate 1' and the counter electrode 25. In this way, deterioration of organic materials due to moisture and the subsequent display degradation can be prevented.

Seventh Embodiment

Figure 8A:
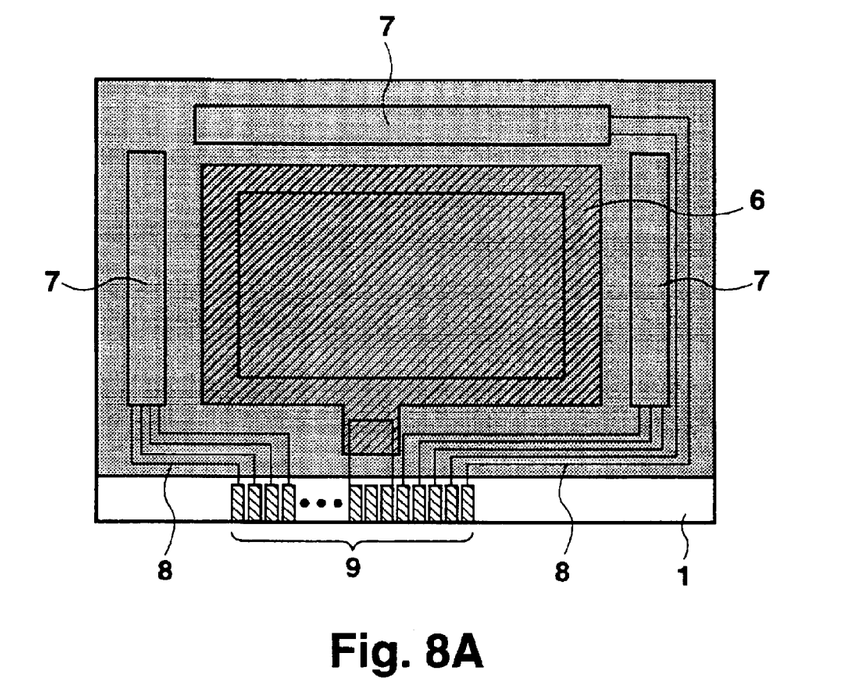
FIGS. 8A and 8B are diagrams showing a configuration related to a seventh embodiment of the organic EL display device according to the present invention.
Figure 8B:
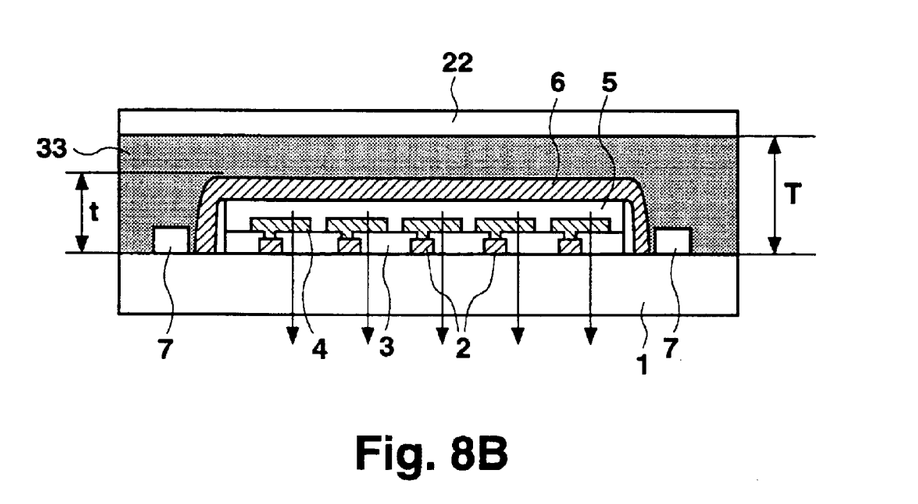

FIG. 8A is a plan view of an organic EL display device according to a seventh embodiment of the present invention, and FIG. 8B shows a cross-sectional view taken along line A—A' of FIG. 8A. Structures similar to those described above in earlier embodiments or elsewhere earlier in the specification are labeled with the same reference numerals, and their detailed explanation will not be repeated.

The feature of the present embodiment is that a resin sealing layer (coating resin layer) 33 is formed covering the entire display region. The second substrate. 22 is arranged over the resin sealing layer 33.

The thickness of the resin sealing layer 33, namely, the space T between the transparent substrate 1 and the second substrate 22, is, for example, approximately between 100 μm and 500 μm. Stated in another way, the space T is approximately 100 to 300 times the thickness t of the display region, and more preferably, 100 to 150 times the thickness t. In the present embodiment, T=150 $\mu$m. The resin sealing layer 33 and the second substrate 22 are formed adhering to one another. The sealed space is filled with the sealing layer 33 in the present embodiment. According to this arrangement, extra space for alignment margin or the like becomes unnecessary, allowing reduction of the thickness of the display device. The size of the gap between the first and the second substrates, namely, the thickness T of the sealing layer 33, is designated as described above taking into account the following points of concern. When the resin sealing layer 33 is too thin, the display region cannot sufficiently be protected, and it becomes difficult to reliably adhere the second substrate 22 to the resin sealing layer 33. On the other hand, when the resin sealing layer 33 is too thick, the area of the side portions of the resin sealing layer 33 exposed to the external air becomes large. The exposed area of resin sealing layer 33 should be as small as possible because the resin used for the resin sealing layer 33 allows slight permeation of moisture.

Powdered desiccant is mixed into the resin sealing layer 33. The desiccant is mixed into the resin before curing the resin sealing layer 33. By curing the resin after the mixture has been thoroughly mixed, the desiccant can be uniformly mixed into the resin sealing layer 33. As the desiccant, a substance having a chemically adsorptive property is used. Examples of chemically adsorptive desiccants include oxides of alkali earth metals such as calcium oxide, barium oxide, halides of alkali earth metals such as calcium chloride, or phosphorus pentaoxide. Physically adsorptive desiccants such as silica gel are not appropriate because such desiccants discharge adsorbed moisture at high temperatures. The resin sealing layer 33 having a desiccant mixed therein as described above is formed covering the display region. Accordingly, there is no space around the display region in which penetrating moisture can collect, and deterioration of the organic EL layer 5 by moisture is thereby prevented. Further, it is unnecessary to provide a desiccant sheet 13 such as those disposed in a device because the resin sealing layer 33 demonstrates sufficient moisture absorbing capability because of the desiccant mixed in the resin sealing layer 33. A desiccant sheet 13 is configured by wrapping desiccant powder with a porous film, and has a thickness of approximately 1 mm. This thickness is large in comparison to the thickness of the display region which is on the order of several $\mu$m. Further, to fix such a desiccant sheet 13 on the inner surface of the cap 10, it is necessary to provide a space 12. Accordingly, a structure using a desiccant sheet is restricted in reducing the overall thickness of an organic EL display device. However, according to the structure of the present embodiment wherein the space between the substrates is filled with the resin sealing layer 33, the thickness of the display device can be greatly reduced because the resin sealing layer 33 has a moisture absorbing property, and no sheet 13 is required.

In addition, moisture on the display region can be uniformly adsorbed from the entire area because the resin sealing layer 33 is uniformly formed over the entire display region. The desiccant does not obstruct hardening of the resin sealing layer 33 when the particle diameter of the desiccant powder is approximately 20 $\mu$m. In a resin sealing layer 33 composed using an ultraviolet curing type resin, when the desiccant particle diameter is excessively large, ultraviolet rays may not be uniformly irradiated, which can delay the resin curing process and cause incomplete hardening. For example, calcium oxide can favorably be used as the desiccant because its particle diameter is approximately 10 $\mu$m.

The resin sealing layer 33 is made of an epoxy resin or a similar material, and preferably is of a type requiring only the mixing of two agents or that is cured by ultraviolet irradiation. Thermosetting resins are not appropriate because the organic EL layer 5 may deteriorate by heating.

Viscosity of the resin sealing layer 33 before hardening should be less than the viscosity of the seal 11 for adhering the cap 10, and may be approximately between 4,500 cps and 50,000 cps. A conventional seal 11 can not readily be employed as the resin sealing layer 33 because the seal 11 has a high viscosity of approximately several hundred thousand cps. At such a viscosity, it is difficult to uniformly mix the desiccant powder into the resin. In addition, a resin having a high viscosity is difficult to be uniformly formed over the entire surface because air bubbles may become trapped inside when installing the second substrate 22. However, it should also be noted that, when the viscosity is too low, the resin may flow before curing.

The desiccant powder is mixed in the resin sealing layer 33 at a weight ratio between 10 wt % and 50 wt %, more preferably between 20 wt % and 40 wt %, and at a volume ratio between 10 vol % and 20 vol %. When the amount of desiccant powder is too small, sufficient moisture adsorption cannot be achieved. On the other hand, when the amount is excessive, the display region cannot be completely covered due to decreased resin viscosity. For example, by using the mixture prepared by mixing calcium oxide powder at 25 wt % into 3112 manufactured by Three Bond corporation, sufficient water resistance can be accomplished without reducing resin viscosity and without causing brittleness in the resin sealing layer 33.

The mixing amount of the desiccant is explained below in further detail. The amount of moisture permeating through a resin differs depending on the resin type. As an example, a resin having a thickness of 0.5 mm composed of XNR5493T manufactured by Nagase Chiba corporation permeates approximately 0.6 g/m$^2$ of moisture per day under 25° C. at a humidity of 50%. When the length of one side of the EL display device is 6 cm, and the thickness of the resin sealing layer 33 is 150 $\mu$m, the area over which the resin sealing layer 33 is exposed to the external atmosphere is $$4 \times 6 \times 10^{-2} \times 150 \times 10^{-6} = 3.6 \times 10^{-5} \ m^2$$

Accordingly, the amount of moisture permeating per day is $$0.6 \times 3.6 \times 10^{-5} = 2.2 \times 10^{-5} \ g/day$$

The amount of calcium oxide required for adsorbing 1 g of moisture is approximately 3 g based on the ratio of molecular weight. When using calcium oxide as the desiccant, the amount of calcium oxide which can completely adsorb moisture for 10 years is $$2.2 \times 10^{-5} \times 3 \times (365 \times 10) = 250 \ mg$$

As the relative weight of the above resin is 1.3, the weight of the resin is $$(6 \ cm \times 6 \ cm \times 150 \ \mu m) \times 1.3 = 700 \ mg$$

Accordingly, the weight percent of the resin is $$250/(250+700) \approx 25 \ wt \ \%$$

This corresponds to approximately 17 vol % when converted into a volume ratio. The optimal desiccant mixture ratio obviously differs depending on various factors such as the expected storage environment, the types of resin and desiccant, and the area size of the EL display device. For example, when the storage environment is expected to be at 30° C. at a humidity of 80%, the permeating moisture amount is approximately doubled. By designating the required amount of calcium oxide for adsorbing moisture for 5 years, the amount becomes half. The desiccant mixture ratio can therefore be defined as between 10 wt % and 50 wt % by weight ratio, and between 8 vol % and 35 vol % by volume ratio.

Next described is a curing method employed when the sealing layer 33 is composed using a resin hardened through exposure to ultraviolet irradiation. As an example of an ultraviolet curing type resin, the 3112 resin manufactured by Three Bond corporation can be cured by irradiating ultraviolet rays using a metal halide lamp for 30 seconds at an intensity of 100 mW/cm$^2$, thereby irradiating a total of 300 mJ/cm$^2$. However, by irradiating such energy on the selective drive circuits 2 including TFTs and other components, various characteristics, such as the on-off characteristic, of the transistors may be altered, and some elements may be destroyed. In order to prevent ultraviolet light from reaching the circuits 2 during ultraviolet curing, it is preferable to form the counter electrode 6 using a conductive film having a light-shielding property, such as a metal thin film of magnesium-indium alloy, magnesium-silver alloy, aluminum-lithium alloy, or a lamination of lithium fluoride and aluminum. A great deal of freedom is available concerning the material choice of the second substrate 22 as described below in more detail, and, in this embodiment, a transparent substrate is employed as the second substrate 22. Ultraviolet light is irradiated through the second substrate 22 to cure the resin. The ultraviolet light transmitted through the second substrate 22 and irradiated on the resin sealing layer 33 are blocked by the counter electrode 6. As the ultraviolet light is prevented from irradiating the selective drive circuits 2, the characteristics of the selective drive circuits 2 remain unchanged. It is preferable that the counter electrode 6 possesses a function to reflect ultraviolet light. The reflected ultraviolet light is again irradiated on the resin sealing layer 33, increasing ultraviolet irradiation efficiency. When it is necessary to form the counter electrode 6 using a transparent material such as ITO due to a matter of device design, a light-shielding film may additionally be formed on the counter electrode 6, namely, between the counter electrode 6 and the sealing layer 33.

The second substrate 22 is next described. A cap 10 is typically formed in the shape of a tray so as to isolate the organic EL layer 5 from the outside. For this reason, as the material for the cap 10, a metal which can easily be shaped by pressing is most often used. In the present embodiment, on the other hand, the display region is sealed by the resin sealing layer 33. The sealed space is filled with the resin sealing layer 33 containing a desiccant, and no desiccant sheet 13 is necessary. In this arrangement, the main characteristics expected of the second substrate 22 are shock resistance for protecting the resin sealing layer from external physical shock, and moisture impermeability for preventing permeation of moisture. It is therefore unnecessary to form the second substrate 22 into a tray shape, and the substrate 22 can be a flat plate. Accordingly, the second substrate 22 may be formed using various materials such as a metal, glass, or a resin plate made of acrylic resin. However, when forming the resin sealing layer 33 using an ultraviolet curing type resin as described above, transparent glass or acrylic resin is most appropriate as the second substrate because ultraviolet light is irradiated through the second substrate 22.

In the present embodiment, it is further effective to form a groove in the substrate 1 or the facing second substrate 22 to place a desiccant 14 therein, similarly as in the second embodiment.

While a color filter or a fluorescent converting layer is provided as a color component in certain examples of the above embodiments, such a color component is unnecessary when color indication is not performed.

Although an organic EL layer is used as an example of the emissive element layer in the above-described embodiments, the present invention can similarly be implemented in a device having an emissive layer of a type other than an organic EL layer, such as an LED or a vacuum display (emissive) device. However, the present invention is considered to realize the most dramatic benefits when applied in a display device using an organic EL layer because an organic EL layer is especially vulnerable to moisture.

While the above descriptions are made referring to a display device, the present invention can also be implemented in a light-emitting device such as an organic EL emissive device used as, for example, a backlight of an LCD. Organic EL emissive devices and other similar devices comprise a sealing structure similar to that of a display device. Accordingly, deterioration of the emissive elements due to moisture can reliably be prevented by using the sealing structure according to the present invention.

While the above embodiments referred to TFTs having a bottom gate type structure, the present invention is not limited to such TFTs. The TFTs may also have a top gate type structure wherein a gate electrode is provided above the active layer.

What is claimed is:

1. An organic electroluminescent display device in which a display region having an organic electroluminescent element is formed between a pair of substrates, wherein said organic electroluminescent element comprises a first electrode, a second electrode, and an organic electroluminescent layer formed between said first and second electrodes, said organic electroluminescent layer emitting light when electric current flows between said first and second electrodes, and a resin having a desiccant mixed therein is disposed between said pair of substrates, wherein said pair of substrates are adhered to one another by a sealing material disposed surrounding at least said display region, so as to seal said display region including said organic electroluminescent element.

2. The display device as defined in claim 1, wherein said resin having said desiccant mixed therein is used as said sealing material.

3. The display device as defined in claim 2, wherein said resin having said desiccant mixed therein is a resin cured by ultraviolet irradiation.

4. A display device as defined in claim 1, wherein said desiccant is a substance having a chemically adsorptive property.

5. An organic electroluminescent display device in which a display region having an organic electroluminescent element is formed between a pair of substrates, wherein said organic electroluminescent element comprises a first electrode, a second electrode, and an organic electroluminescent layer formed between said first and second electrodes, said organic electroluminescent layer emitting light when electric current flows between said first and second electrodes, and a resin having a desiccant mixed therein is disposed between said pair of substrates, wherein said resin is disposed surrounding said display region.

6. The display device as defined in claim 5, wherein
said display region having said organic electroluminescent is formed on a first substrate among said pair of substrates;
a second substrate among said pair of substrates is arranged facing the display region side of said first substrate and adhered to said first substrate;
a color component is provided in a gap between said second substrate and said display region; and
said second substrate is a transparent substrate which transmits at least visible light.

7. The display device as defined in claim 5, wherein
said display region having said organic electroluminescent is formed on a first substrate among said pair of substrates;
a second substrate among said pair of substrates is arranged facing the display region side of said first substrate and adhered to said first substrate; and
a spacer composed of a desiccant is provided in a gap between said second substrate and said display region.

8. The display device as defined in claim 5, wherein said desiccant is mixed in said resin at a ratio of at least 10 wt %, but no more than 50 wt %.

9. The display device as defined in claim 5, wherein said resin having said desiccant mixed therein is a resin cured by ultraviolet irradiation.

10. A display device in which a display region having a self-emissive element is formed between a pair of substrates, wherein
a resin having a desiccant mixed therein is disposed between said pair of substrates, and
said resin having said desiccant mixed therein is located in a gap between said pair of substrates and covers at least said display region.

11. The display device as defined in claim 10, wherein said resin having said desiccant mixed therein is a resin cured by ultraviolet irradiation.

12. The electroluminescence display device as defined in claim 11, wherein
a desiccant is mixed in said coating resin layer.

13. The electroluminescence display device as defined in claim 11, wherein
said coating resin layer having said desiccant mixed therein covers said self-emissive element and fills a gap between said first and said second substrates.

14. The electroluminescence display device as defined in claim 11, wherein
said self-emissive element is composed by laminating, in order from the first substrate side, said first electrode, said emissive element layer, and said second electrode; and
said coating resin layer covers said self-emissive element from the second substrate side.

15. The electroluminescence display device as defined in claim 11, wherein
a light-shielding layer for blocking ultraviolet rays is disposed between said emissive element layer and said coating resin layer.

16. The electroluminescence display device as defined in claim 15, wherein
said, second electrode simultaneously serves as said light-shielding layer.

17. The electroluminescence display device as defined in claim 16, wherein
a desiccant is mixed in said coating resin layer.

18. The electroluminescence display device as defined in claim 16, wherein
said desiccant is a powder having a particle diameter of 20 $\mu$m or less.

19. The electroluminescence display device as defined in claim 11, wherein said desiccant is mixed in a resin constituting said coating resin layer at a ratio of at least 10 wt %, but no more than 50 wt %.

20. The display device as defined in claim 10, wherein
said resin having said desiccant mixed therein fills said gap between said pair of substrates.

21. A display device as defined in claim 10, wherein
a resin having a desiccant mixed therein is disposed between said pair of substrates, and
said desiccant is a powder having a particle diameter of 20 $\mu$m or less.

22. The display device as defined in claim 10, wherein
said desiccant is mixed in said resin at a ratio of at least 10 wt %, but no more than 50 wt %.

23. A display device in which a display region having a self-emissive element is formed between a pair of substrates, wherein
said pair of substrates are adhered to one another by a sealing material disposed surrounding at least said display region, so as to seal said display region;
a groove is formed in at least one of said pair of substrates on a side facing the other substrate in a location where said sealing material is disposed; and
a desiccant is filled in said groove.

24. The display device as defined in claim 23, wherein
a resin having a desiccant mixed therein is used as said sealing material.

25. The display device as defined in claim 24, wherein
said resin having said desiccant mixed therein is a resin cured by ultraviolet irradiation.

26. The display device as defined in claim 23, wherein
said self-emissive element is an electroluminescence element.

27. The display device as defined in claim 26, wherein
said display region having said self-emissive element is formed on a first substrate among said pair of substrates; a second substrate among said pair of substrates is arranged facing the display region side of said first substrate and adhered to said first substrate;
a color component is provided in a gap between said second substrate and said display region; and
said second substrate is a transparent substrate which transmits at least visible light.

28. The display device as defined in claim 26, wherein
said display region having said self-emissive element is formed on a first substrate among said pair of substrates;
a second substrate among said pair of substrates is arranged facing the display region side of said first substrate and adhered to said first substrate; and
a spacer composed of a desiccant is provided in a gap between said second substrate and said display region.

29. The display device as defined in claim 23, wherein
said self-emissive element is an organic electroluminescence element containing an organic compound in an emissive element layer.

30. The display device as defined in claim 23, wherein
said resin having said desiccant mixed therein is located in a gap between said pair of substrates and covers at least said display region.

31. The display device as defined in claim 30, wherein said resin having said desiccant mixed therein fills said gap between said pair of substrates.

32. The display device as defined in claim 23, wherein said desiccant is a substance having a chemically adsorptive property.

33. The display device as defined in claim 23, wherein said desiccant is a powder having a particle diameter of 20 μm or less.

34. The display device as defined in claim 23, wherein said desiccant is mixed in said resin at a ratio of at least 10 wt %, but no more than 50 wt %.

35. A light-emitting device in which an emissive region having a self-emissive element is formed between a pair of substrates, wherein said pair of substrates are adhered to one another by a sealing material disposed surrounding at least said emissive region, so as to seal said emissive region;

a groove is formed in at least one of said pair of substrates on a side facing the other substrate in a location where said sealing material is disposed; and a desiccant is filled in said groove.

36. A display device in which a display region having a self-emissive element is formed between a pair of substrates, wherein said self-emissive element comprises a first electrode, a second electrode, and an emissive layer formed between said first and second electrodes, and a resin having a desiccant mixed therein is disposed between said pair of substrates such that said resin surrounds said self-emissive element comprising said first electrode, said emissive layer, and said second electrode.

37. The display device as defined in claim 36, wherein said pair of substrates are adhered to one another by a sealing material disposed surrounding at least said display region, so as to seal said display region including said self-emissive element.

38. The display device as defined in claim 37, wherein said resin having said desiccant mixed therein is used as said sealing material.

39. The display device as defined in claim 38, wherein said resin having said desiccant mixed therein is a resin cured by ultraviolet irradiation.

40. The display device as defined in claim 36, wherein said self-emissive element is an electroluminescence element.

41. The display device as defined in claim 40, wherein said display region having said self-emissive element is formed on a first substrate among said pair of substrates;

a second substrate among said pair of substrates is arranged facing the display region side of said first substrate and adhered to said first substrate;

a color component is provided in a gap between said second substrate and said display region; and said second substrate is a transparent substrate which transmits at least visible light.

42. The display device as defined in claim 40, wherein said display region having said self-emissive element is formed on a first substrate among said pair of substrates;

a second substrate among said pair of substrates is arranged facing the display region side of said first substrate and adhered to said first substrate; and a spacer composed of a desiccant is provided in a gap between said second substrate and said display region.

43. The display device as defined in claim 36, wherein said self-emissive element is an organic electroluminescence element containing an organic compound in an emissive element layer.

44. The display device as defined in claim 36, wherein said desiccant is mixed in said resin at a ratio of at least 10 wt %, but no more than 50 wt %.

* * * * *